United States Patent [19]

Kim

[11] Patent Number: 5,796,661
[45] Date of Patent: Aug. 18, 1998

[54] OUTPUT BUFFER CIRCUIT OF SEMICONDUCTOR MEMORY DEVICE

[75] Inventor: Kyung-Saeng Kim, Choongcheongbuk, Rep. of Korea

[73] Assignee: LG Semicon Co., Ltd., Chungcheongbuk-Do, Rep. of Korea

[21] Appl. No.: 890,025

[22] Filed: Jul. 10, 1997

[30] Foreign Application Priority Data

Jul. 22, 1996 [KR] Rep. of Korea ............... 1996 29547

[51] Int. Cl.$^6$ .................................................. G11C 7/00
[52] U.S. Cl. ............................. 365/189.05; 365/233.5
[58] Field of Search ........................... 365/189.05, 233, 365/233.5; 326/57, 58

[56] References Cited

U.S. PATENT DOCUMENTS 5,355,349  10/1994  Sakata ................................. 365/233.5
5,384,735   1/1995  Park et al. ........................ 365/189.05

Primary Examiner—David C. Nelms
Assistant Examiner—Son Mai
Attorney, Agent, or Firm—Morgan, Lewis & Bockius LLP

[57] ABSTRACT

An output buffer circuit of a semiconductor memory device, the circuit includes an address transition detector detecting a transition of address signals, a NOR gate coupled to the address transition detector and receiving signals from the address transition detector and on output enable signal and outputting a signal having a logical NOR result, a decoder decoding the address signals, a memory unit coupled to the decoder and outputting data from the decoder, a sensing amplifier coupled to the memory unit and amplifying data outputted from the memory unit, an output data controller coupled to the NOR gate and the sensing amplifier and controlling output signals from the NOR gate and the sensing amplifier, a data output unit coupled to the pull-up unit and the output data controller and outputting data in accordance with output signals from the output data controller, a preset unit coupled to the output data controller and presetting an output terminal of the data output unit during a pulse interval of an output signal from the address transition detector, a pull-up unit coupled to the output data controller and the preset unit and pulling up a voltage of the output terminal according to the output signal from the address transition detector and the data outputted from the memory unit.

17 Claims, 3 Drawing Sheets

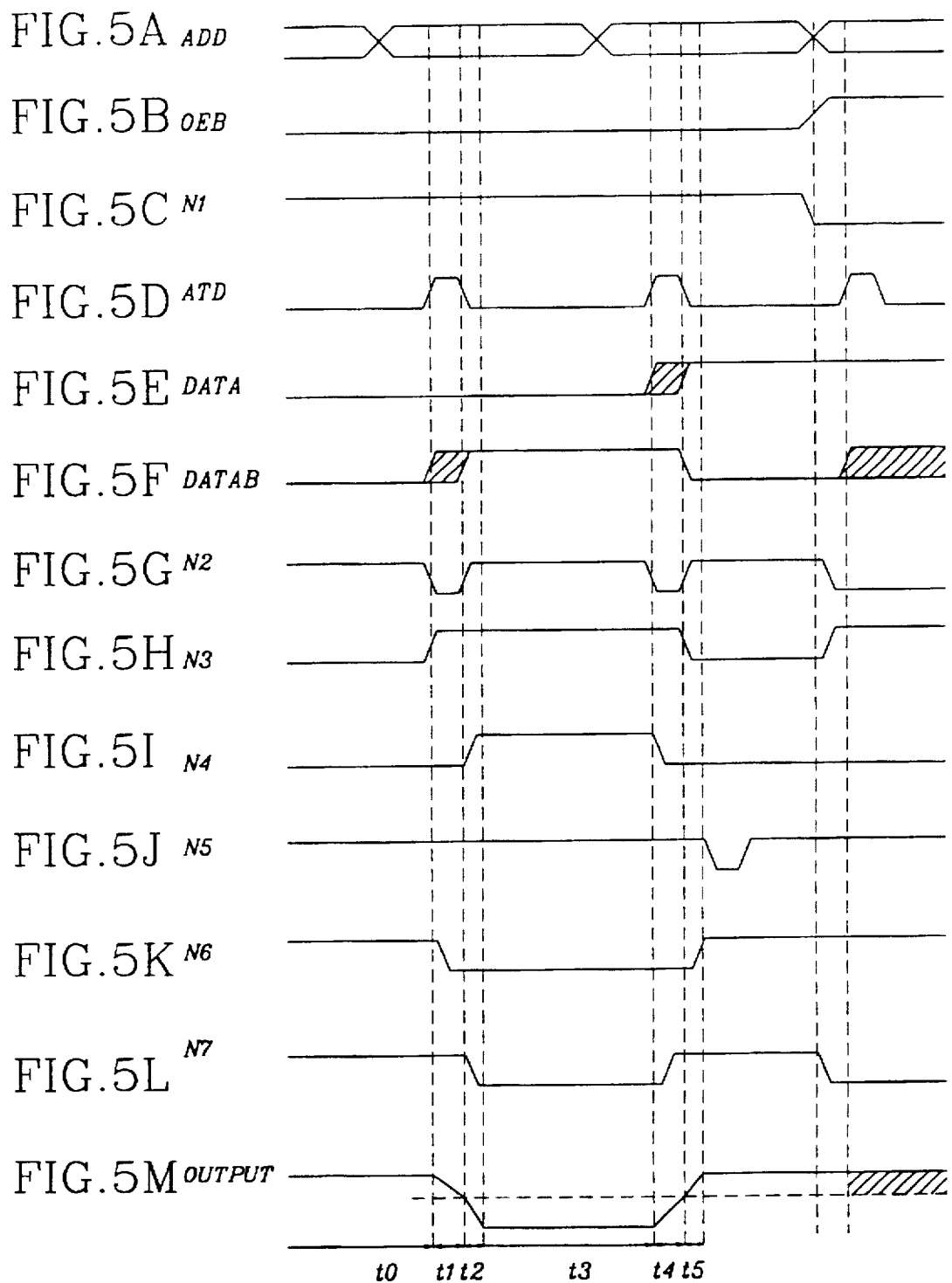

OUTPUT BUFFER CIRCUIT OF SEMICONDUCTOR MEMORY DEVICE

This application claims the benefit of Application No. 29547/1996, filed in Korea on Jul. 22, 1996, which is hereby incorporated by reference.

BACKGROUND OF THE INVENTION

1. Field of the Invention

The present invention relates to a semiconductor memory device, and more particularly, to an output buffer circuit of a semiconductor memory device. Although the present invention is suitable for a wide scope of applications, it is particularly suitable for reducing power consumption as well as improving output data transition speed.

2. Description of the Related Art

As shown in FIG. 1, a conventional output buffer circuit includes an address transition detector 10 detecting the transition of an externally applied address signal, a decoder 20 decoding the address signal, a memory unit 30 reading data from cells in accordance with the address signal assigned by the decoder 20, an OR gate 40 ORing an address transition detecting signal ATD from the detector 10 and a control signal φ, a latch unit 50 sequentially latching and operating each of the data read from the memory unit 30 and the signal applied from the OR gate 40 and outputting the data, a data output unit 70 outputting the data from the latch unit 50 in accordance with the control signal φ, and a preset unit 60 presetting the output terminal at the data output unit 70 to a predetermined level when the address transition detecting signal ATD is applied from the address transition detector 10.

As shown in FIG. 2, the address transition detector 10 of FIG. 1 includes a delay unit 11 sequentially delaying the address signal using four inverters 11-1, 11-2, 11-3, and 11-4 in series, and an exclusive OR gate 12 for exclusively performing a logic operation on the output from the delay unit 11 with the externally applied address signal and outputting the address transition detecting signal ATD.

The latch unit 50 as shown in FIG. 1 includes a pair of inverters 51, 52 inverting the data read from the memory unit 30, a NOR gate 53 for performing a logic operation on the signal output from the inverter 51 and the OR gate 40, a NAND gate 54 for performing a logic operation on the signal from the inverter 51 and the signal from the inverter I1 through the OR gate-40, and another pair of inverters 55, 56 inverting outputs from the NOR gate 53 and the NAND gate 54, respectively.

In the preset unit 60, an NMOS transistor 61 and a PMOS transistor 62 are serially connected to each other between a supply potential Vcc and a ground potential and respectively receiving the address transition detecting signal ATD and an inverted address transition detecting signal ATD, and also having the connecting point between the drain and the source connected to the output terminal OUT in the data output unit 70. Reference numerals I2 and CL denote an inverter and a load capacitance, respectively.

The operation of the conventional output buffer circuit will now be described with reference to FIGS. 3A to 3C.

When an address signal as shown in FIG. 3A is applied to the address transition detector 10, a high level address transition detecting signal ATD as shown in FIG. 3B is sent to each of the preset unit 60 and the OR gate 40. The decoder 20 decodes and outputs the externally applied address signal to the memory unit 30 to retrieve the data stored in the cells of the memory unit 30. In this process, when the control signal φ and the address transition detecting signal ATD remain low during an interval to the output from the latch unit 50 is decided by the data read from the memory unit 30, and the data output unit 70 outputs data through the output terminal OUT in accordance with the output from the latch unit 50.

When a high level address transition detecting signal ATD is outputted during the interval t1, the OR gate 40 for performing a logic operation on the low level control signal φ and the high level address transition detecting signal ATD and transmits a resulting high signal to each one of inputs of the NOR gate 53 and the NAND gate 54.

At this time, when a data "1" is outputted from the memory unit 30, the data "1" is inverted through the inverter 51 in the latch unit 50 into "0" and is applied to each one of other input terminals of the NOR gate 53 and the NAND gate 54, and the resulting signals are inverted respectively through the inverters 55, 56 into a high level signal for the NOR gate 53 and a low level signal for the NAND gate 54. As a result, NMOS and PMOS transistors 71, 72 in the data output unit 70 are turned off and the output terminal OUT becomes a high impedance level.

Also, in accordance with the high level address transition detecting signal ATD from the address transition detector 10, the NMOS and the PMOS transistors 61, 62 in the preset unit 60 are turned on so that the output terminal OUT in the data output unit 70 is preset at ½ Vcc according to the turn-on resistance, as shown in FIG. 3C.

Thereafter, when the address transition detecting signal ATD becomes low, the NMOS and the PMOS transistors 61, 62 in the preset unit 60 are turned off, and the OR gate 40 transmits a low level signal to the latch unit 50. Subsequently, the inverters 55, 56 output low and high level signals, respectively.

As a result, the PMOS transistor 71 in the data output unit 70 is turned on and the NMOS transistor 72 is turned off as shown in FIG. 3C. Accordingly, the output terminal OUT is set at the supply voltage Vcc during an interval t2 and then outputs a data "1".

As shown in FIG. 3A, when another address signal is applied to the memory unit 30, and a data "0" is read therefrom, the address transition detector 10 again outputs a high level address transition detecting signal ATD. Then, each of the NMOS and the PMOS transistors 71, 72 in the data output unit 70 is turned off and each of the NMOS and PMOS transistors 61, 62 in the preset unit 60 is turned on. Thus, as shown in FIG. 3C, the output terminal OUT in the data output unit 70 is preset at ½ Vcc during the interval t3 in accordance with the turn-on resistance of the NMOS and PMOS transistors 61, 62.

When the address transition detecting signal ATD is again turned to a low level, the NMOS and PMOS transistors 61, 62 in the preset unit 60 are turned off and then the NMOS and the PMOS transistors 71, 72 in the data output unit 70 are turned off and on, respectively. Consequently, the output terminal OUT is set at the ground voltage Vss during the interval t4 and outputs a data "0".

Accordingly, conventional output buffer circuit detects the address transition detecting signal ATD whenever an externally applied address signal changes its level, presets the output from the data output unit 70 at ½ Vcc, and performs the data reading process.

However, the conventional output buffer circuit having a data output level preset by the operation of the preset unit does not improve the data transition speed. Further, since the supply potential Vcc is supplied using PMOS transistors, the power consumption becomes greatly increased in the conventional output buffer circuit.

SUMMARY OF THE INVENTION

Accordingly, the present invention is directed to an output buffer circuit of semiconductor memory device that substantially deviates one or more of the problems due to limitations and disadvantages of the related art.

An object of the present invention is to provide an output buffer circuit for improving an output data transition speed and reducing the power consumption by employing pull-down or pull-up transistors during the operating of a preset circuit in accordance with an address transition detecting signal.

To achieve the above-described object, in another aspect of the present invention, an output buffer circuit of a semiconductor memory device having an address transition detector detecting a transition of an address signal, a sensing amplifier amplifying an output data from a memory unit, and a NOR gate for NORing an output enable signal and an address transition detecting signal, the circuit includes an output data controller coupled to the sensing amplifier and controlling output signals from the NOR gate and the sensing amplifier, a preset unit coupled to the output data controller, a pull-up unit coupled to the preset unit and the output data controller and pulling up a voltage of the output terminal in accordance with the address transition detecting signal and the data read from the memory unit, and a data output unit coupled to the pull-up unit, the preset unit, and the output data controller and outputting data in accordance with output signals from the output data controller, and the preset unit presetting an output terminal of the data output unit during a pulse interval of the address transition detecting signal.

In another aspect of the present invention, an output buffer circuit of a semiconductor memory device having an address transition detector detecting a transition of an address signal, a sensing amplifier amplifying an output data from a memory unit, and a NOR gate for NORing a delayed output enable signal and an address transition detecting signal, the circuit includes an output data controller coupled to the sensing amplifier and controlling output signals from the NOR gate and the sensing amplifier, a data output unit coupled to the output data controller which includes PMOS and NMOS transistors serially connected to each other between a supply voltage and a ground voltage and each having drains connected to an output terminal of the data output unit, a pull-up PMOS transistor having a drain, source, and gate respectively connected to the output terminal, the supply voltage, and a pull-up unit, a pull-up NMOS transistor and a pull-down PMOS transistor serially connected to each other between the supply voltage and the ground voltage and each having drains connected to the output terminal, a preset unit having an inverter and first and second NAND gates and for turning on the pull-up NMOS transistor and the pull-down PMOS transistor in accordance with a read data value, an output enable signal, and an address transition detecting signal and presetting the pull-up NMOS transistor, the inverter and the second NAND gate respectively connected to gates of the pull-up NMOS transistor and the pull-down PMOS transistor, and a pull-up unit for turning on the pull-up PMOS transistor during an output data transmission to pull-up an output terminal.

In a further aspect of the present invention, an output buffer circuit of a semiconductor memory device, the circuit includes an address transition detector detecting a transition of address signals, a NOR gate coupled to the address transition detector and receiving output signals from the address transition detector and on output enable signal and outputting a signal having a logical NOR result, a decoder decoding the address signals, a memory unit coupled to the decoder and reading data allocated by the decoder, a sensing amplifier coupled to the memory unit and amplifying the data read from the memory unit, an output data controller coupled to the NOR gate and the sensing amplifier and controlling output signals from the NOR gate and the sensing amplifier, a data output unit coupled to the pull-up unit and the output data controller and outputting data in accordance with output signals from the output data controller, a preset unit coupled to the output data controller and presetting an output terminal of the data output unit during a pulse interval of an output signal from the address transition detector, a pull-up unit coupled to the output data controller and the preset unit and pulling up a voltage of the output terminal according to the output signal from the address transition detector and the data read from the memory unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 5A through 5M are timing diagrams of the circuit shown in FIG. 4.

DETAILED DESCRIPTION OF THE PREFERRED EMBODIMENTS

Reference will now be made in detail to the embodiments of the present invention, examples of which are illustrated in the accompanying drawings.

Figure 1:
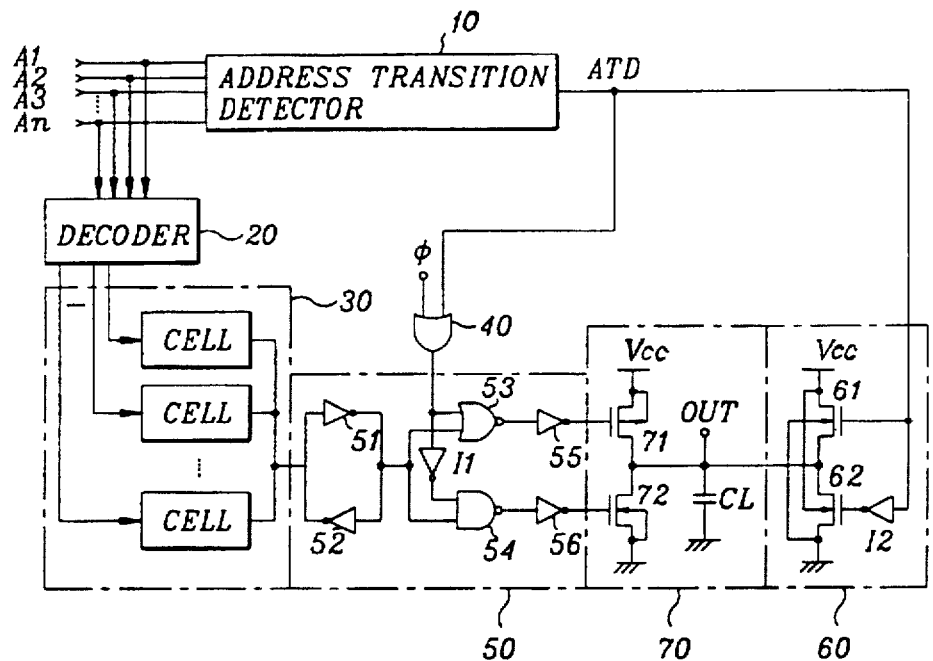
FIG. 1 is a block diagram of a conventional output buffer circuit of a semiconductor memory device.
Figure 2:
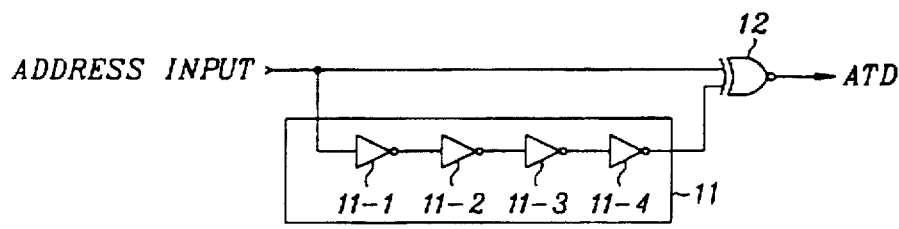
FIG. 2 is a detailed block diagram of an address transition detector shown in FIG. 1.
Figure 3A:
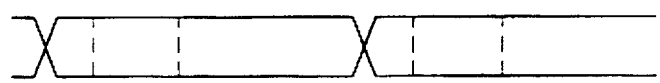
FIGS. 3A through 3C are timing diagrams of the circuit shown in FIG. 1.
Figure 3B:
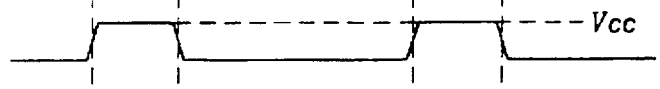
Figure 3C:
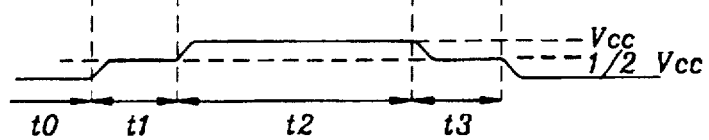
Figure 4:
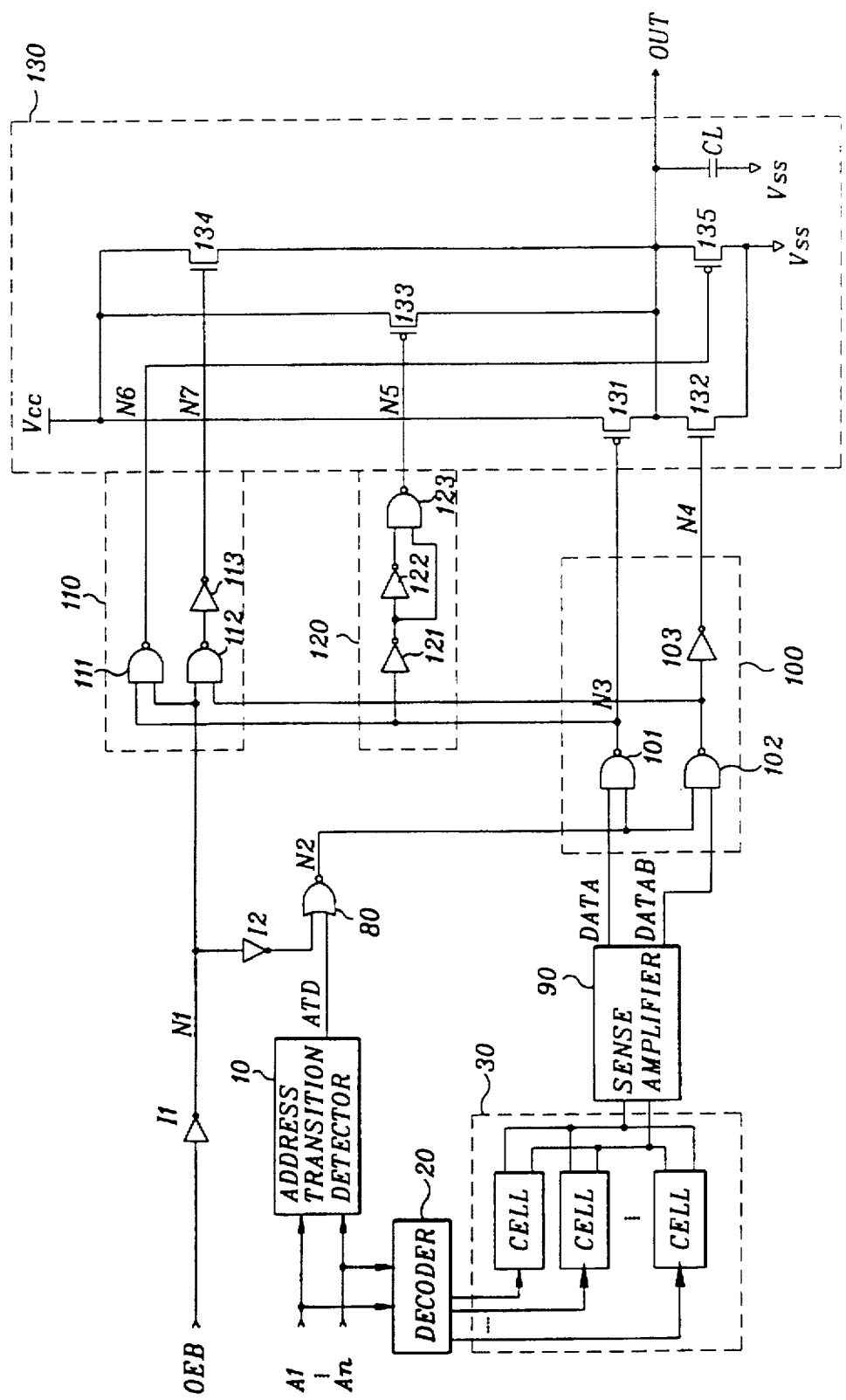
FIG. 4 is a block diagram of an output buffer circuit of a semiconductor memory device in accordance with a preferred embodiment of the present invention.

As illustrated in FIG. 4, an output buffer circuit of a semiconductor memory device in accordance with the present invention includes an address transition detector 10 detecting the transition of externally applied address signals A1, A2, . . . , An, a decoder 20 decoding the address signals A1, A2, . . . , An, a memory unit 30 reading data from a plurality of cells in accordance with the address signal allocated by the decoder 20, a sensing amplifier 90 amplifying the data read from the memory unit 30, a NOR gate 80 for performing a logic operation on an output enable signal OEB delayed for a predetermined time and an address transition detecting signal ATD from the address transition detector 10, an output data controller 100 controlling output signals DATA, DATAB from the sensing amplifier 90 in accordance with an output signal from the NOR gate 80, a preset unit 110 presetting an output terminal OUT during a pulse interval of the address transition detecting signal ATD, a pull-up unit 120 pulling up the output terminal OUT in accordance with the address transition detecting signal ATD and the data read from the memory unit 30, and a data output unit 130 outputting the read data in accordance with outputs from the output data controller 100.

Specifically, the output data controller 100 of the output buffer circuit shown in FIG. 4 includes a NAND gate 101 for performing a logic operation on a data signal DATA from the sensing amplifier 90 and a signal N2 from the NOR gate 80, another NAND gate 102 for performing a logic operation on the signal N2 from the NOR gate and a data signal DATAB from the sensing amplifier 90, and an inverter 103 for reversing the output signal from the NAND gate 102.

The preset unit 110 includes a pair of NAND gates 111, 112, for performing a logic operation on outputs from the NAND gates 101, 102 and the output enable signal OEB, and an inverter 113 for reversing the output signal from the NAND gate 112.

The pull-up unit 120 includes a pair of inverters 121, 122 for sequentially reversing the output signal from the NAND gate 101, and a NAND gate 123 for performing a logic operation on the output signals from the inverters 121, 122.

The data output unit 130 includes PMOS and NMOS transistors 131, 132 serially connected to each other between a supply voltage Vcc and a ground voltage Vss and each having drains connected to an ad output terminal OUT, a pull-up PMOS transistor 133 having a drain, source and gate connected to the output terminal OUT, the supply voltage Vcc and the output NAND gate 123 in the pull-up unit 120, respectively, a pull-up NMOS transistor 134 and a pull-down PMOS transistor 135 serially connected to each other between the supply voltage Vcc and the ground voltage Vss and each having drains connected to the output terminal OUT and gates connected to the outputs of the inverter 113 and the NAND gate 111 in the preset unit 110, respectively.

With reference to FIGS. 4 and 5A through 5M, the operation of the output buffer circuit in accordance with the present invention will now be described.

First, when an output enable signal OEB and an address transition detecting signal ATD are set at a low level as shown in FIGS. 5B and 5D, the NOR gate 80 outputs a high level signal N2 as shown in FIG. 5G.

In accordance with the output from the NOR gate 80, node signals N3 and N4, which are output signals from the data output controller 100, are decided by the data logic values of the outputs from the memory unit 30 and the sensing amplifier 90 and the decided output values of the node signals N3 and N4 selectively turn on the PMOS transistor 131 or the NMOS transistor 132. Accordingly, the output terminal OUT is turned to a high or low level and outputs data.

Initially, a data "1" is outputted from the output terminal OUT during the interval t0 according to an externally applied address signal ADD as shown in FIG. 5A and the data signals DATA, DATAB as shown in FIGS. 5E and 5F.

At this time, when the transition of the input address ADD occurs, the address transition detector 10 outputs the address transition detecting signal ATD having a certain pulse width during the interval t1 data as shown in FIG. 5D and the sensing amplifier 90 outputs the data of "1" DATA and a "don't care" data DATAB as shown in cross hatching in FIGS. 5E and 5F.

Consequently, the node signals N3 and N4 in the data output controller 100 are turned to high and low levels for t1, respectively, so that the PMOS and NMOS transistor 131, 132 are turned off to set the output terminal OUT to be a high impedance.

The NAND gate 111 in the preset unit 110 performs a logic operation on the outputs from the NAND gate 101 and the inverter I1, and the NAND gate 112 performs a logic operation on the outputs from the NAND gate 102 and the inverter I1, and the inverter 113 reverses the output from the NAND gate 112 to provide the node signals N6, N7 as shown in FIGS. 5K and 5L. Therefore, the pull-up NMOS transistor 134 and the pull-down transistor 135 in the data output unit 130 are turned on by the node signals N6, N7, so that the output terminal OUT is precharged at a ½ supply voltage (Vcc) according to the turned-on resistance.

When the address transition detecting signal ATD is turned to low, the node signals N4, N7 becomes high and low, respectively. As a result, the NMOS transistor 132 and the NMOS transistor 134 are turned on and off, respectively.

The output terminal OUT precharged at the ½ Vcc is discharged fast enough through the NMOS transistor 132 and the pull-down PMOS transistor 135 turned on during the interval t2 to output a data "0" during the interval t3.

That is, the output terminal OUT is precharged from the supply voltage Vcc to the ½ Vcc by using the pull-up NMOS transistor 134 and the pull-down PMOS transistor 135 during a high level address transition detecting signal ATD. Conversely, during a low level address transition detecting signal ATD the ½ Vcc is discharged to the ground voltage Vss in accordance with the operation of the NMOS transistor 132 and the pull-down PMOS transistor 135.

When another address transition signal occurs, the address transition detector 10 outputs a high level address transition detecting signal ATD during the interval t4, and the NOR gate 80 outputs a low level signal.

The sensing amplifier 90 outputs the data of "1" DATA irrespective of the output of the sensing amplifier 90 and a "don't care" data signal DATA as shown in FIGS. 5E and 5F, so that the node signals N3, N4 are turned to high and low levels, and the PMOS transistor 131 and the NMOS transistor 132 in the data output unit 130 are turned off accordingly.

The node signals N6, N7 from the preset unit 110 turn on the NMOS transistor 134 and the PMOS transistor 135 in the data output unit 130, so that the output terminal OUT is precharged to the ½ Vcc during the interval t4.

When the address transition detecting signal ATD is turned low and a high level data signal DATA is outputted through the sensing amplifier 90, the node signals N3, N4 are turned to a low and high level, respectively as shown in FIGS. 5H and 5I.

The PMOS transistor 131 is then turned on and the PMOS transistor 135 is turned off. The output signals from the PMOS transistor 131 and the PMOS transistor 135 are pulled up to the level of the supply voltage Vcc by the operation of the PMOS transistor 131 and the NMOS transistor 134.

When the node signal N3 is turned low, the pull-up unit 120 generates a pulse having a certain width as shown in FIG. 5J, and the pull-up PMOS transistor 133 is turned on during a certain time after the PMOS transistor 131 is turned on to charge the output terminal OUT from ½ Vcc to the supply voltage Vcc.

Also, since the output terminal OUT entirely charged to the supply voltage Vcc turns off the pull-up PMOS transistor 133, only a voltage line through PMOS transistor 131 is maintained without using both lines through the PMOS transistor 131 and the pull-up PMOS transistor 133. As a result, the power consumption is greatly reduced.

As described above, the output buffer circuit according to the present invention enhances a data output speed and decreases the electric power consumption by providing pull-down and pull-up transistors with the pull-up PMOS transistor receiving a pulse having a certain width at the gate by precharging the output terminal in accordance with a data logic value.

What is claimed is:

1. An output buffer circuit of a semiconductor memory device having an address transition detector detecting a transition of an address signal, a sensing amplifier amplifying an output data from a memory unit, and a NOR gate for NORing an output enable signal and an address transition detecting signal, the circuit comprising:

an output data controller coupled to the sensing amplifier and controlling output signals from the NOR gate and the sensing amplifier;

a preset unit coupled to the output data controller;

a pull-up unit coupled to the preset unit and the output data controller and pulling up a voltage of the output terminal in accordance with the address transition detecting signal and the data read from the memory unit;

a data output unit coupled to the pull-up unit, the preset is unit, and the output data controller and outputting data in accordance with output signals from the output data controller, and the preset unit presetting an output terminal of the data output unit during a pulse interval of the address transition detecting signal.

2. The circuit according to claim 1, wherein the output data controller comprises:

a first NAND gate for NANDing a first data signal from the sensing amplifier;

a second NAND gate for NANDing the output signal from the NOR gate and a second data signal from the sensing amplifier; and an inverter for inverting an output signal from the second NAND gate.

3. The circuit according to claim 1, wherein the preset unit comprises:

first and second NAND gates for respectively NANDing signals from the output data controller and the output enable signal; and an inverter for inverting an output signal from the second NAND gate.

4. The circuit according to claim 1, wherein the pull-up unit comprises:

a pair of inverters for sequentially inverting a signal from the output data controller; and a NAND gate for NANDing output signals from each of the inverters.

5. The circuit according to claim 1, wherein the data output unit comprises:

a PMOS transistor and an NMOS transistor serially connected to each other between a supply voltage and a ground voltage and having drains connected to the output terminal of the data output unit;

a pull-up PMOS transistor having a drain, source, and gate respectively connected to the output terminal of the data output unit, the supply voltage, and the pull-up unit; and a pull-up NMOS transistor and a pull-down PMOS transistor serially connected to each other between the supply voltage and the ground voltage, the pull-up NMOS transistor and the pull-down PMOS transistor having drains connected to the output terminal of the data output unit and gates connected to an output of the preset unit, respectively.

6. An output buffer circuit of a semiconductor memory device having an address transition detector detecting a transition of an address signal, a sensing amplifier amplifying an output data from a memory unit, and a NOR gate for NORing a delayed output enable signal and an address transition detecting signal, the circuit comprising:

an output data controller coupled to the sensing amplifier and controlling output signals from the NOR gate and the sensing amplifier;

a data output unit coupled to the output data controller which includes:

PMOS and NMOS transistors serially connected to each other between a supply voltage and a ground voltage and each having drains connected to an output terminal of the data output unit, a pull-up PMOS transistor having a drain, source, and gate respectively connected to the output terminal, the supply voltage, and a pull-up unit, a pull-up NMOS transistor and a pull-down PMOS transistor serially connected to each other between the supply voltage and the ground voltage and each having drains connected to the output terminal, a preset unit having an inverter and first and second NAND gates and for turning on the pull-up NMOS transistor and the pull-down PMOS transistor in accordance with a read data value, an output enable signal, and an address transition detecting signal and presetting the pull-up NMOS transistor, the inverter and the second NAND gate respectively connected to gates of the pull-up NMOS transistor and the pull-down PMOS transistor; and a pull-up unit for turning on the pull-up PMOS transistor during an output data transmission to pull-up an output terminal.

7. The circuit according to claim 6, wherein the preset unit simultaneously turns on the pull-up NMOS transistor and the pull-down PMOS transistor at a high level address transition detecting signal to preset the output terminal at a ½ supply voltage.

8. The circuit according to claim 6, wherein the preset unit and the data output controller turn on the pull-down PMOS transistor and the pull-up NMOS transistor, respectively at a low level address transition detecting signal to pull down the output terminal to a ½ supply voltage in accordance with a data signal from the sensing amplifier and then turn on the pull-down PMOS transistor and the pull-up NMOS transistor so as to pull up the output terminal of the data output unit to the supply voltage.

9. The circuit according to claim 6, wherein the pull-up unit generates an additional pulse signal to turn on the pull-up PMOS transistor to pull up the output terminal of the data output unit to the supply voltage when the PMOS is turned on.

10. An output buffer circuit of a semiconductor memory device, the circuit comprising:

an address transition detector detecting a transition of address signals;

a NOR gate coupled to the address transition detector and receiving signals from the address transition detector and an output enable signal and outputting a signal having a logical NOR result;

a decoder decoding the address signals;

a memory unit coupled to the decoder and outputting data from the decoder;

a sensing amplifier coupled to the memory unit and amplifying data outputted from the memory unit;

an output data controller coupled to the NOR gate and the sensing amplifier and controlling output signals from the NOR gate and the sensing amplifier;

a data output unit coupled to the pull-up unit and the output data controller and outputting data in accordance with output signals from the output data controller;

a preset unit coupled to the output data controller and presetting an output terminal of the data output unit during a pulse interval of an output signal from the address transition detector; and a pull-up unit coupled to the output data controller and the preset unit and pulling up a voltage of the output terminal of the data output unit according to the output signal from the address transition detector and the data outputted from the memory unit.

11. The circuit according to claim 10, wherein the output data controller comprises:

a first NAND gate receiving a first data signal from the sensing amplifier and the signal from the NOR gate and outputting a signal having a first logical NAND result;

a second NAND gate receiving a second data signal from the sensing amplifier and the signal from the NOR gate and outputting a signal having a second logical NAND result; and an invertor inverting the signal outputted from the second NAND gate.

12. The circuit according to claim 10, wherein the preset unit comprises:

first and second NAND gates receiving respectively output signals from the output data controller and the output enable signal and outputting signals having first and second logical NAND results; and an invertor inverting the signal from the second NAND result.

13. The circuit according to claim 10, wherein the pull-up unit comprises:

first and second inverters connecting in series and inverting an output signal from the output data controller; and a NAND gate receiving signals respectively from the first and second inverters and outputting a signal having a logical NAND result.

14. The circuit according to claim 10, wherein the data output unit comprises:

a PMOS transistor and an NMOS transistor serially connected to each other between a supply voltage and a ground voltage and having drains connected to the output terminal of the data output unit;

a pull-up PMOS transistor having a drain, source, and gate respectively connected to the output terminal, the supply voltage, and the pull-up unit; and a pull-up NMOS transistor and pull-down PMOS transistor serially connected to each other between the supply voltage and the ground voltage, the pull-up NMOS transistor and the pull-down PMOS transistor having drains connected to the output terminal and gates connected to an output of the preset unit; and a load capacitance connected to the output terminal and the supply voltage.

15. The circuit according to claim 14, wherein the preset unit simultaneously turns on the pull-up NMOS transistor and the pull-down PMOS transistor at a high level address transition detecting signal to preset the output terminal of the data output unit at a ½ supply voltage.

16. The circuit according to claim 14, wherein the preset unit and the data output controller turn on the pull-down PMOS transistor and the pull-up NMOS transistor, respectively at a low level of the address transition detecting signal to pull down the output terminal of the data output unit to a ½ supply voltage in accordance with a data signal from the sensing amplifier and then turn on the pull-down PMOS transistor and the pull-up NMOS transistor so as to pull up the output terminal to the supply voltage.

17. The circuit according to claim 14, wherein the pull-up unit generates an additional pulse signal to turn on the pull-up PMOS transistor to pull up the output terminal of the data output unit to the supply voltage when the PMOS is turned on.

\* \* \* \* \*

UNITED STATES PATENT AND TRADEMARK OFFICE
CERTIFICATE OF CORRECTION

PATENT NO. : 5,796,661
DATED : August 18, 1998
INVENTOR(S) : KIM

It is certified that error appears in the above-identified patent and that said Letters Patent is hereby corrected as shown below:

Column 7, Line 28, delete "is".

Signed and Sealed this

Second Day of March, 1999

Attest:

Q. TODD DICKINSON

Attesting Officer

Acting Commissioner of Patents and Trademarks